United States Patent
Nam et al.

(10) Patent No.: US 10,163,511 B2
(45) Date of Patent: Dec. 25, 2018

(54) NONVOLATILE MEMORY DEVICE AND STORAGE DEVICE INCLUDING NONVOLATILE MEMORY DEVICE

(71) Applicants: Sang-Wan Nam, Hwaseong-si (KR); Sang-In Park, Anyang-si (KR)

(72) Inventors: Sang-Wan Nam, Hwaseong-si (KR); Sang-In Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/614,671

(22) Filed: Jun. 6, 2017

(65) Prior Publication Data
US 2018/0047449 A1 Feb. 15, 2018

(30) Foreign Application Priority Data
Aug. 10, 2016 (KR) .......................... 10-2016-0101997

(51) Int. Cl.
| | |
|---|---|
| *G11C 7/22* | (2006.01) |
| *G11C 16/08* | (2006.01) |
| *G11C 8/06* | (2006.01) |
| *G11C 11/408* | (2006.01) |
| *G11C 11/4099* | (2006.01) |
| *G11C 16/34* | (2006.01) |
| *G11C 16/10* | (2006.01) |
| *G11C 29/02* | (2006.01) |
| *H03K 19/02* | (2006.01) |

(52) U.S. Cl.
CPC ............... *G11C 16/08* (2013.01); *G11C 8/06* (2013.01); *G11C 11/4082* (2013.01); *G11C 11/4087* (2013.01); *G11C 11/4099* (2013.01); *G11C 16/10* (2013.01); *G11C 16/34* (2013.01); *G11C 16/3454* (2013.01); *G11C 29/028* (2013.01); *H03K 19/02* (2013.01)

(58) Field of Classification Search
CPC .................................. G11C 7/22; G11C 16/10
USPC ......................................... 365/185.22, 189.05
See application file for complete search history.

(56) References Cited

U.S. PATENT DOCUMENTS

| | | | |
|---|---|---|---|
| 7,035,143 B2 | 4/2006 | Lee | |
| 7,679,133 B2 | 3/2010 | Son et al. | |
| 8,139,413 B2 * | 3/2012 | Kim | G11C 16/08 365/185.11 |
| 8,553,466 B2 | 10/2013 | Han et al. | |

(Continued)

FOREIGN PATENT DOCUMENTS

KR 10-2006-0120889 A 11/2006

*Primary Examiner* — Michael Tran
(74) *Attorney, Agent, or Firm* — Volentine, Whitt & Francos, PLLC

(57) ABSTRACT

A nonvolatile memory device includes a memory cell array, a row decoder circuit, a page buffer circuit, and a control logic circuit. The control logic circuit controls the row decoder circuit and the page buffer circuit to perform: (1) a pre-program of sequentially selecting a plurality of memory blocks and increasing threshold voltages of string selection transistors or ground selection transistors of the selected memory block and (2) after the pre-program is completed, a main program of sequentially selecting the plurality of memory blocks, programming string selection transistors or ground selection transistors of the selected memory block, and performing a verification by using a verification voltage.

20 Claims, 13 Drawing Sheets

(56) References Cited

U.S. PATENT DOCUMENTS

| | | | |
|---|---|---|---|
| 8,559,235 B2 | 10/2013 | Yoon et al. | |
| 8,654,585 B2 | 2/2014 | Oh et al. | |
| 8,654,587 B2 | 2/2014 | Yoon et al. | |
| 8,861,282 B2* | 10/2014 | Dutta | G11C 16/3418 365/185.01 |
| 8,867,271 B2 | 10/2014 | Li et al. | |
| 8,913,432 B2 | 12/2014 | Dong et al. | |
| 8,971,119 B2 | 3/2015 | Avila et al. | |
| 8,995,192 B2 | 3/2015 | Khouri et al. | |
| 9,019,775 B2* | 4/2015 | Costa | G11C 5/02 365/185.17 |
| 9,147,471 B2* | 9/2015 | Lee | G11C 16/0483 |
| 9,147,472 B2* | 9/2015 | Sawamura | G11C 16/06 |
| 9,183,935 B2* | 11/2015 | Fukuzumi | G11C 16/0483 |
| 9,330,780 B1* | 5/2016 | Lee | G11C 16/3454 |
| 9,536,613 B2* | 1/2017 | Lee | G11C 16/10 |
| 9,627,076 B2* | 4/2017 | Nam | G11C 16/0483 |
| 9,659,636 B2* | 5/2017 | Lee | G11C 11/5635 |
| 9,853,090 B2* | 12/2017 | Konevecki | H01L 27/2454 |
| 9,886,150 B2* | 2/2018 | Yamamoto | G06F 3/044 |
| 2009/0027967 A1* | 1/2009 | Lee | G11C 16/0483 365/185.15 |
| 2009/0257280 A1* | 10/2009 | Oh | G11C 16/0483 365/185.19 |
| 2009/0287879 A1* | 11/2009 | Oh | G11C 16/0483 711/103 |
| 2011/0233648 A1 | 9/2011 | Seol et al. | |
| 2012/0281475 A1* | 11/2012 | Oh | G11C 16/0483 365/185.17 |
| 2012/0300550 A1* | 11/2012 | Hemink | G11C 16/10 365/185.17 |
| 2013/0322174 A1* | 12/2013 | Li | G11C 16/0483 365/185.09 |
| 2014/0092685 A1* | 4/2014 | Yoon | G11C 16/0483 365/185.17 |
| 2015/0003157 A1* | 1/2015 | Aritome | G11C 16/0408 365/185.11 |
| 2016/0099047 A1* | 4/2016 | Lee | G11C 7/1039 365/185.03 |
| 2017/0353271 A1* | 12/2017 | Kudekar | H04L 1/0063 |

\* cited by examiner

| Option A | Pre Program of SST |
| --- | --- |
| Option B | Pre Program of GST |
| Option C | Main Program of SST |
| Option D | Main Program of GST |

ST

| 1st Scheme | A/B → C/D |
| --- | --- |
| 2nd Scheme | (A → C)/(B → D) |
| 3rd Scheme | A/B → A/B → C/D |
| 4th Scheme | (A → A)/(B → B) → C/D |
| 5th Scheme | (A → A → C)/(B → B → D) |

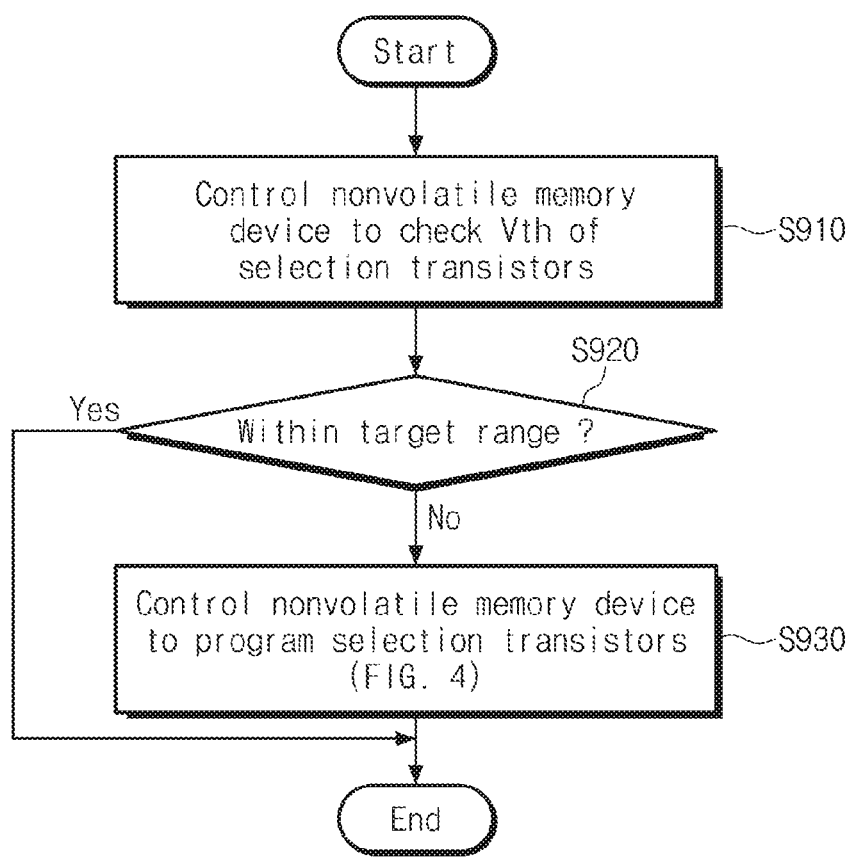

NONVOLATILE MEMORY DEVICE AND STORAGE DEVICE INCLUDING NONVOLATILE MEMORY DEVICE

CROSS-REFERENCE TO RELATED APPLICATIONS

A claim for priority under 35 U.S.C. § 119 is made to Korean Patent Application No. 10-2016-0101997 filed Aug. 10, 2016, in the Korean Intellectual Property Office, the entire contents of which are hereby incorporated by reference.

BACKGROUND

Embodiments of the disclosure relate to a semiconductor circuit, and more particularly, to a nonvolatile memory device and a storage device including the nonvolatile memory device.

A storage device refers to a device, which stores data under control of a host device, such as a computer, a smartphone, and a smart pad. The storage device includes a device, which stores data on a magnetic disk, such as a hard disk drive (HDD), or a device, which stores data on a semiconductor memory, in particular, a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

The degree of integration of the storage device and a volume thereof continue to increase as semiconductor manufacturing technologies develop. The high degree of integration of the storage device makes it possible to reduce costs needed to manufacture the storage device. However, the high degree of integration of the storage device causes scale-down and a structure change of the storage device, and thus various new problems occur. Since such issues cause a damage of data stored in the storage device, the reliability of the storage device may be lowered. There is a need for a method and a device capable of improving the reliability of the storage device.

SUMMARY

Embodiments of the disclosure provide a nonvolatile memory device with improved reliability and a storage device including the nonvolatile memory device.

According to an aspect of the disclosure, a nonvolatile memory device includes a memory cell array, a row decoder circuit, a page buffer circuit, and a control logic circuit. The memory cell array includes a plurality of memory blocks, each of which includes a plurality of cell strings that each has a ground selection transistor, a plurality of memory cells, and a string selection transistor. The row decoder circuit is connected to ground selection transistors, memory cells, and string selection transistors of each memory block through ground selection lines, word lines, and string selection lines. The page buffer circuit is connected to the string selection transistors of the cell strings of each memory block through a plurality of bit lines. The control logic circuit controls the row decoder circuit and the page buffer circuit to perform a pre-program of sequentially selecting the plurality of memory blocks and increasing threshold voltages of the string selection transistors or the ground selection transistors of the selected memory block and to perform, after the pre-program is completed, a main program of sequentially selecting the plurality of memory blocks, programming the string selection transistors or the ground selection transistors of the selected memory block, and performing verification by using a verification voltage.

According to another aspect of the disclosure, a storage device includes a nonvolatile memory device and a controller controlling the nonvolatile memory device. The nonvolatile memory device includes a memory cell array, a row decoder circuit, a page buffer circuit, and a control logic circuit. The memory cell array includes a plurality of memory blocks, each of which includes a plurality of cell strings that each has a ground selection transistor, a plurality of memory cells, and a string selection transistor. The row decoder circuit is connected to ground selection transistors, memory cells, and string selection transistors of each memory block through ground selection lines, word lines, and string selection lines. The page buffer circuit is connected to the string selection transistors of the cell strings of each memory block through a plurality of bit lines. The control logic circuit controls the row decoder circuit and the page buffer circuit to perform a pre-program of sequentially selecting the plurality of memory blocks and increasing threshold voltages of the string selection transistors or the ground selection transistors of the selected memory block and to perform, after the pre-program is completed, a main program of sequentially selecting the plurality of memory blocks, programming the string selection transistors or the ground selection transistors of the selected memory block, and performing verification by using a verification voltage.

According to another aspect of the disclosure, a nonvolatile memory device includes a memory cell array having a plurality of cell strings, each of the cell strings has a selection transistor that selects the cell string for a program, read, or erase operation and a plurality of memory cells that store data for later retrieval. A row decoder circuit addresses the selection transistor of each of the cell strings through a separate selection line and, for each of the cell strings, addresses each of the memory cells of the cell string through a separate word line. Each of the word lines addresses a single memory cell within each of the cell strings. A page buffer circuit addresses each of the cell strings through a bit line. A control logic circuit controls the row decoder circuit and the page buffer circuit to perform a pre-program operation of increasing a threshold voltage of every selection transistor addressed by the bit line before executing a program verification operation on any of the selection transistors addressed by the bit line.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 10 shows an option table of options for programming selection transistors and a scheme table in which the options are combined;

FIG. 13 is a flowchart illustrating an example in which the storage device determines whether to perform a program option of selection transistors, according to an embodiment of the disclosure.

DETAILED DESCRIPTION

Below, embodiments of the disclosure will be described clearly and in detail with reference to the accompanying drawings to such an extent that an ordinary person in the art may implement embodiments of the invention.

Figure 1:
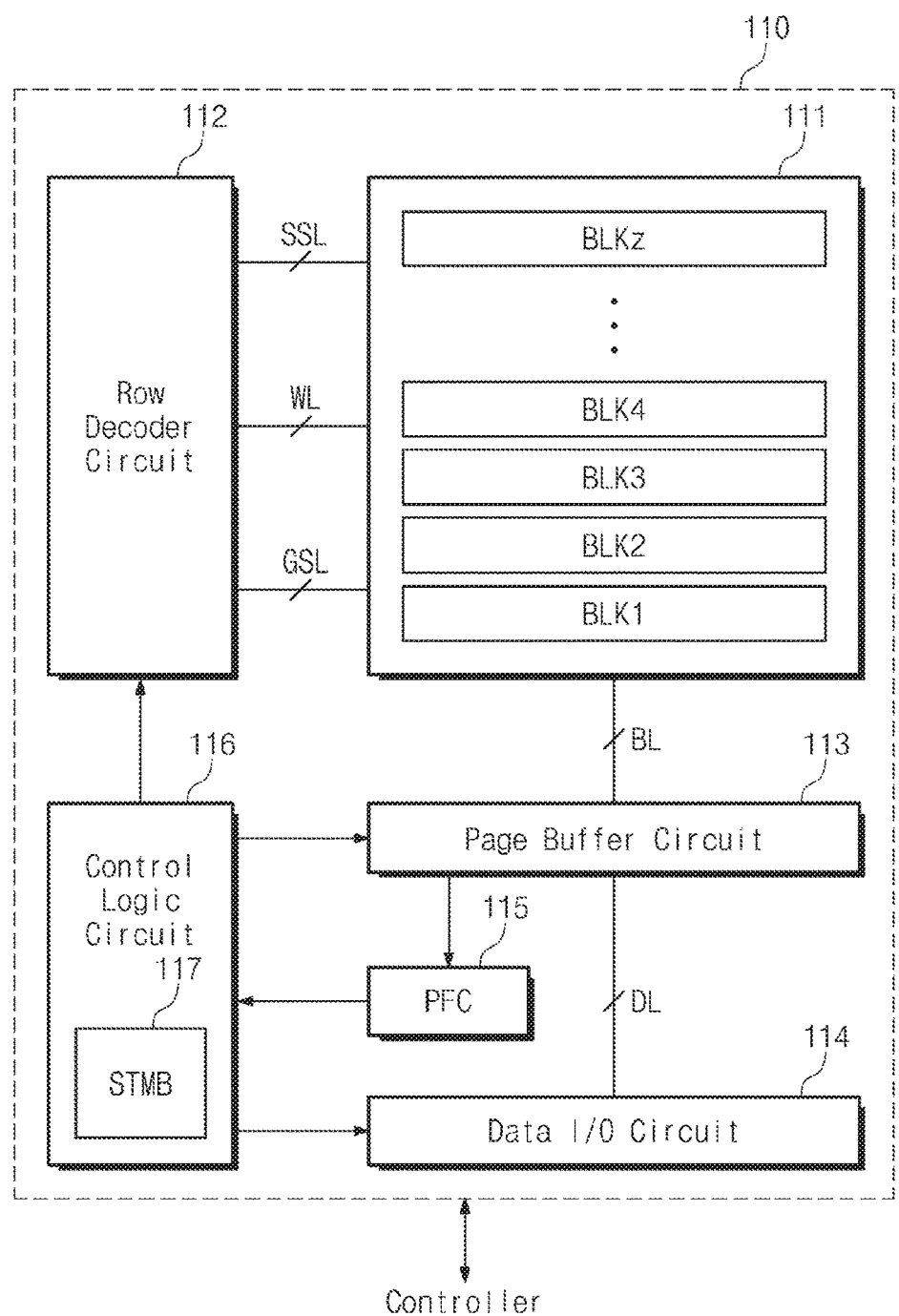
FIG. 1 is a block diagram illustrating a nonvolatile memory device, according to an embodiment of the disclosure.

FIG. 1 is a block diagram illustrating a nonvolatile memory device 110, according to an embodiment of the disclosure. Referring to FIG. 1, the nonvolatile memory device 110 includes a memory cell array 111, a row decoder circuit 112, a page buffer circuit 113, a data input/output circuit 114, a pass-fail check circuit (PFC) 115, and a control logic circuit 116.

The memory cell array 111 includes a plurality of memory blocks BLK1 to BLKz. Each of the memory blocks BLK1 to BLKz includes a plurality of memory cells. Each of the memory blocks BLK1 to BLKz may be connected to the row decoder circuit 112 through at least one ground selection line GSL, a plurality of word lines WL, and at least one string selection line SSL. Each of the memory blocks BLK1 to BLKz may be connected to the page buffer circuit 113 through a plurality of bit lines BL. The memory blocks BLK1 to BLKz may be connected in common to the bit lines BL. The memory cells of the memory blocks BLK1 to BLKz may have the same structure.

In an embodiment, each of the memory blocks BLK1 to BLKz may correspond to a unit of an erase operation. The memory cells of the memory cell array 111 may be erased for each memory block. The memory cells belonging to a memory block may be erased at the same time. As another example, each of the memory blocks BLK1 to BLKz may be divided into a plurality of sub-blocks. Each sub-block may correspond to a unit of an erase operation.

The row decoder circuit 112 may be connected to the memory cell array 111 through a plurality of ground selection lines GSL, the plurality of word lines WL, and a plurality of string selection lines SSL. The row decoder circuit 112 is controlled by the control logic circuit 116. The row decoder circuit 112 may decode an address received from a controller 120 (refer to FIG. 12) through an input/output channel and may control application of voltages to the string selection lines SSL, the word lines WL, and the ground selection lines GSL based on the decoded address.

For example, during a program operation, the row decoder circuit 112 may apply a program voltage to a selected word line of a memory block selected by an address and may apply a pass voltage to each of unselected word lines of the selected memory block. During a read operation, the row decoder circuit 112 may apply a selection read voltage to a selected word line of a memory block selected by an address and may apply a non-selection read voltage to each of unselected word lines of the selected memory block. During an erase operation, the row decoder circuit 112 may apply erase voltages (e.g., a ground voltage or low voltages of which the levels are similar to that of the ground voltage) to word lines of a memory block selected by an address.

The page buffer circuit 113 is connected to the memory cell array 111 through the bit lines BL. The page buffer circuit 113 is connected to the data input/output circuit 114 through a plurality of data lines DL. The page buffer circuit 113 is controlled by the control logic circuit 116.

During the program operation, the page buffer circuit 113 may store data to be programmed in memory cells. The page buffer circuit 113 may apply voltages to the bit lines BL based on the stored data. For example, the page buffer circuit 113 may function as a write driver. During the read operation or a verification read operation, the page buffer circuit 113 may sense voltages on the bit lines BL and may store the sensed result. For example, the page buffer circuit 113 may function as a sense amplifier.

The data input/output circuit 114 is connected with the page buffer circuit 113 through the data lines DL. The data input/output circuit 114 may output data, which is read by the page buffer circuit 113, to the controller 120 through the input/output channel and may send data, which is received from the controller 120 through the input/output channel, to the page buffer circuit 113.

After the verification read operation, the pass-fail check circuit 115 may receive a sensing result from the page buffer circuit 113. The pass-fail check circuit PFC may determine a program pass or a program fail based on the received sensing result. For example, during a program verification read operation, the page buffer circuit 113 may count the number of on-cells that are turned on. When the number of on-cells is not less than a threshold value, the pass-fail check circuit 115 may determine that the program operation is not successful (that is, program fail). When the number of on-cells is smaller than the threshold value, the pass-fail check circuit 115 may determine that the program operation is successful (that is, program pass). For example, during an erase verification read operation, the page buffer circuit 113 may count the number of off-cells that are turned off. When the number of on-cells is not less than a threshold value, the pass-fail check circuit 115 may determine that the erase operation is not successful (that is, erase fail). When the number of off-cells is smaller than the threshold value, the pass-fail check circuit 115 may determine that the erase operation is successful (that is, erase pass). The pass or fail determination result may be sent to the control logic circuit 116.

The control logic circuit 116 may receive a command from the controller 120 through the input/output channel and may receive a control signal from the controller 120 through a control channel. The control logic circuit 116 may receive a command through the input/output channel in response to the control signal, may route an address, which is received through the input/output channel, to the row decoder circuit 112, and may route data, which is received through the input/output channel, to the data input/output circuit 114. The control logic circuit 116 may decode the received command and may control the nonvolatile memory device 110 based on the decoded command.

The control logic circuit 116 includes a selection transistor managing block (STMB) 117. The selection transistor managing block 117 may manage selection transistors of the memory blocks BLK1 to BLKz, that is, threshold voltages of string selection transistors and ground selection transistors. For example, the selection transistor managing block 117 may perform a program operation for increasing threshold voltages of the selection transistors. The selection transistor managing block 117 may perform a program operation on the selection transistors through a pre-program and a main program. Also, the selection transistor managing block 117 may perform a read operation on the selection transistors to determine whether threshold voltages of the selection transistors are higher or lower than a read level.

Figure 2:
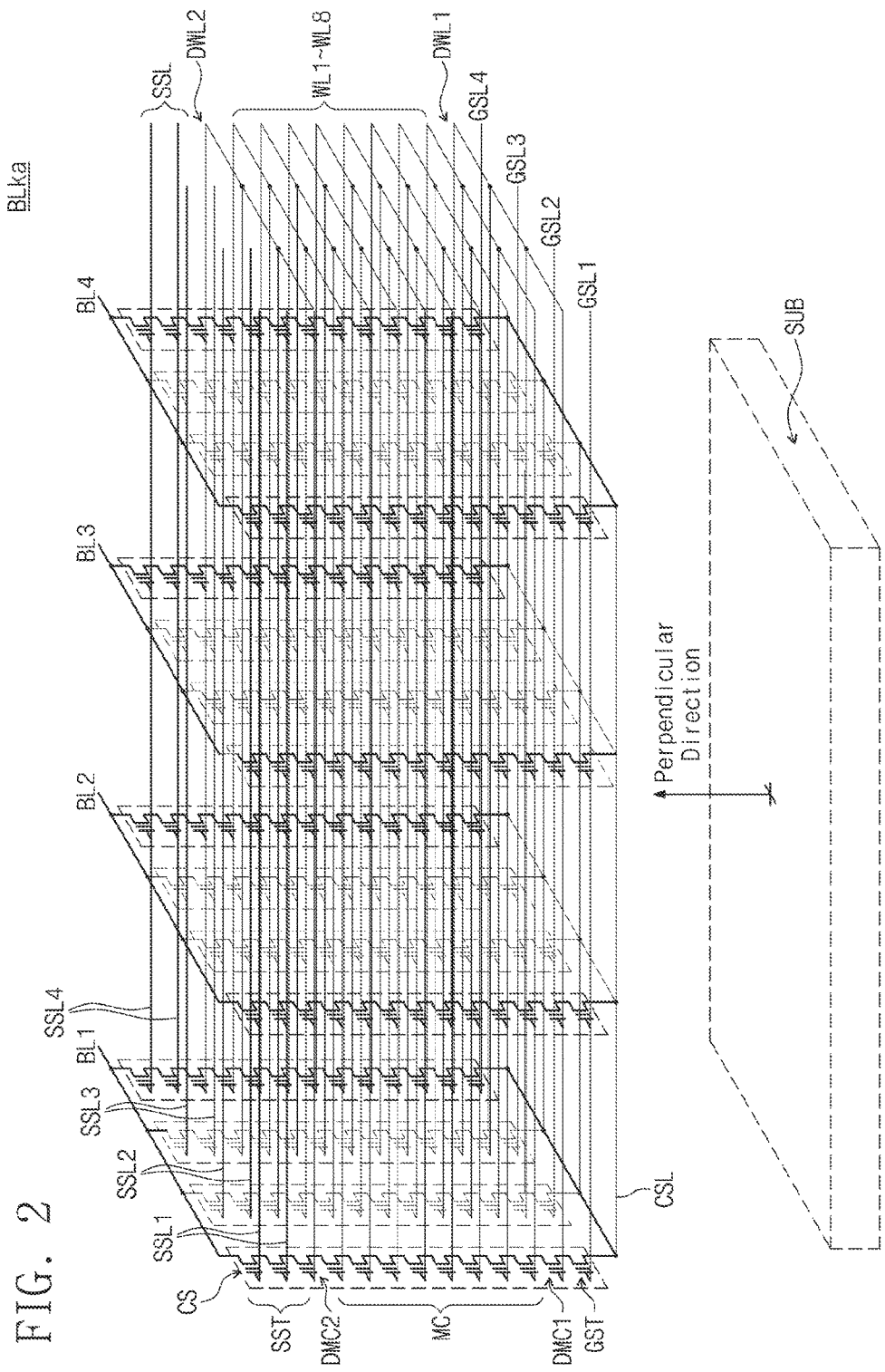
FIG. 2 shows an example of a memory block according to an embodiment of the disclosure.

FIG. 2 illustrates an example of a memory block BLKa according to an embodiment of the disclosure. Referring to FIGS. 1 and 2, a plurality of cell strings CS may be arranged on a substrate SUB in rows and columns. The cell strings CS may be connected in common to a common source line CSL that is formed on (or in) the substrate SUB. In FIG. 2, a location of the substrate SUB is exemplified to help understand a structure of the memory block BLKa. An embodiment is exemplified in FIG. 2 in which the common source line CSL is connected to lower ends of the cell strings CS. However, it is sufficient that the common source line CSL is electrically connected to the lower ends of the cell strings CS. However, embodiments of the disclosure may not be limited to the case where the common source line CSL is physically arranged at the lower ends of the cell strings CS. An embodiment is exemplified in FIG. 2 in which the cell strings CS are arranged in a four-by-four matrix. However, the number of cell strings CS in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be light.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along the direction perpendicular to the substrate SUB.

In an embodiment, as illustrated in FIG. 2, one or more dummy memory cells may be arranged between the ground selection transistor GST and the memory cells MC in each cell string CS. In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to form one threshold voltage distribution range or to form threshold voltage distributions of which the number is less than the number of threshold voltage distributions of the memory cells MC.

Memory cells of the cell strings CS that are arranged at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. An embodiment is exemplified in FIG. 2 as memory cells of the same height are connected to the same word line. However, the memory cells of the same height may be directly connected to each other in a plane where the memory cells are formed or may be indirectly connected to each other through another layer such as a metal layer.

The memory block BLKa may be provided as a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the disclosure, the 3D memory array includes vertical NAND strings (or cell strings) that are vertically oriented such that at least one memory cell is located over another memory cell. The at least one memory cell may comprise a charge trap layer. Each vertical NAND strings may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
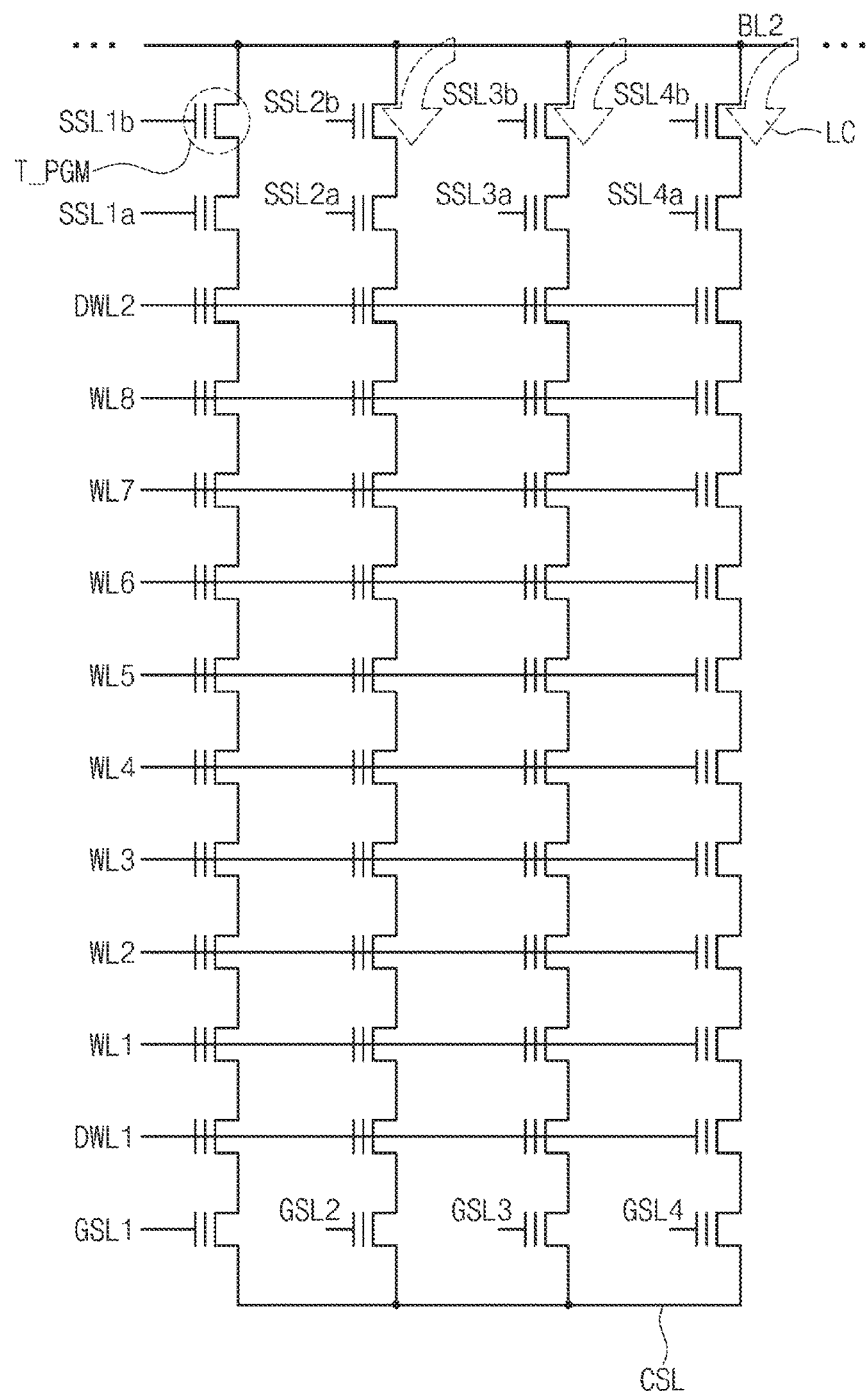
FIG. 3 shows an issue that is generated upon programming string selection transistors of a memory block which are connected to a bit line.

FIG. 3 shows an issue that is generated upon programming the string selection transistors SST of a memory block BLKa which are connected to a bit line. In an embodiment, cell strings of the memory block BLKa connected to a second bit line BL2 are illustrated in FIG. 3. In an embodiment, it is assumed that the string selection transistors SST adjacent to the bit line BL2 are connected to string selection lines SSL1b to SSL4b and the string selection transistors SST adjacent to dummy memory cells DMC2 are connected to string selection lines SSL1a to SSL4a. In an embodiment, the program operation may be sequentially performed for every selection transistor (string selection transistors or ground selection transistors) connected to each selection line (a string selection line or a ground selection line) of each memory block. For example, it is assumed that the program operation is performed on string selection transistors SST connected to the string selection line SSL1*b* of the memory block BLKa.

In an embodiment, the program operation of the string selection transistors SST may include one or more program loops. Each program loop may include a program period and a program verification period. In the program period, the string selection transistors SST may be programmed by the Fowler-Nordheim (F-N) tunneling or hot electron injection. For example, threshold voltages of the string selection transistors may increase by applying voltages, which have a voltage difference inducing the F-N tunneling, to control gates and channels of the string selection transistors SST. As another example, threshold voltages of the string selection transistors may increase by applying voltages, which have a voltage difference inducing generation of hot electrons, to drains and sources of the string selection transistors SST and applying a voltage, which induces injection of hot electrons, to the control gates of the string selection transistors SST.

In the program verification period, a positive voltage may be applied to the bit line BL2, a verification voltage may be applied to the control gates of the string selection transistors SST, which are the program operation target T_PGM, through the string selection line SSL1*b*, and turn-on voltages may be respectively applied to word lines WL1 to WL8, the dummy word lines DWL1 and DWL2, the ground selection line GSL, and the string selection lines SSL1*a*, SSL2*a*, SSL3*a*, and SSL4*a* connected to the string selection transistors SST that are not the program operation target T_PGM. A turn-off voltage is applied to the string selection lines SSL2*b* to SSL4*b* connected to the string selection transistors that are situated at the same height as that of the string selection transistors corresponding to the program operation target T_PGM and are not the program operation target T_PGM. The turn-on voltage may be a voltage that turns on corresponding memory cells, corresponding dummy memory cells, or corresponding selection transistors. The turn-off voltage may be a ground voltage or a negative voltage.

According to the above-described condition, string selection transistors (e.g., first selection transistors), of which the threshold voltages are lower than a verification voltage, of the string selection transistors corresponding to the program operation target T_PGM are turned on, and string selection transistors (e.g., second selection transistors), of which the threshold voltages are higher than the verification voltage, of the string selection transistors corresponding to the program operation target T_PGM are turned off. Voltages of bit lines that respectively correspond to the first selection transistors are discharged to the common source line CSL, and voltages of bit lines that respectively correspond to the second selection transistors are not discharged to the common source line CSL. That is, whether threshold voltages of the string selection transistors corresponding to the program operation target T_PGM reach the verification voltage may be determined according to voltage changes in the bit lines BL1 to BL4.

When the program operation is performed on string selection transistors connected to the string selection line SSL1*b*, string selection transistors that are situated at the same height as that of the string selection transistors corresponding to the program operation target T_PGM and are not the program operation target T_PGM may not yet experience the program operation. That is, after the program operation is performed on the string selection transistors connected to the string selection line SSL1*b*, the program operation may be performed on string selection transistors SST connected to the string selection lines SSL2*b* to SSL4*b*. In this case, threshold voltages of the string selection transistors SST connected to the string selection lines SSL2*b* to SSL4*b* may not yet be adjusted, for example, may be lower than the turn-off voltage. More particularly, it is very difficult to adjust threshold voltages of selection transistors within an intended range in a process of manufacturing the memory cell array 111 having the 3D structure as illustrated in FIG. 2. For example, in general, adjusting threshold voltages of transistors in the manufacturing process may be accomplished by adjusting the doping concentration of P-type or N-type impurities. However, at least some of selection transistors are situated at a place, which is difficult to be doped with the P-type or N-type impurities, due to a characteristic of the process of manufacturing the memory cell array 111 of the 3D structure illustrated in FIG. 2. Accordingly, threshold voltages of at least some of the selection transistors may not be adjusted and may be lower than the turn-off voltage.

When threshold voltages of the string selection transistors SST connected to the string selection lines SSL2*b* to SSL4*b* are lower than the turn-off voltage, the string selection transistors SST connected to the string selection lines SSL2*b* to SSL4*b* are turned on in the program verification period. Accordingly, a voltage of the bit line BL2 is leaked out to (or discharged) the common source line CSL through the string selection transistors SST connected to the string selection lines SSL2*b* to SSL4*b* (refer to "LC"). That is, since threshold voltages of the string selection transistors SST corresponding to the program operation target T_PGM are always lower than the verification voltage, an operation of the program verification period may not be normally performed.

The above-described issue may be equally generated when the program operation is performed on other string selection transistors SST or ground selection transistors GST in the memory block BLKa. Also, the above-described issue is not limited to one memory block. Since the memory blocks BLK1 to BLKz (refer to FIG. 1) share bit lines, the above-described issue may be generated in all the memory blocks BLK1 to BLKz. For example, each of the memory blocks BLK1 to BLKz may have the same structure as that illustrated in FIGS. 2 and 3. The bit lines BL1 to BL4 are connected in common to the memory blocks BLK1 to BLKz. Accordingly, when the program operation is performed on selection transistors of the memory block BLK1, the turn-off voltages are supplied to the remaining memory blocks BLK2 to BLKz. The turn-off voltage may be a ground voltage or a negative voltage. If selection transistors of the remaining memory blocks BLK2 to BLKz are not yet programmed, voltages of the bit lines BL1 to BL4 may be discharged through the memory blocks BLK2 to BLKz when the program operation is performed on selection transistors of the memory block BLK1.

To solve the above-described issue, the nonvolatile memory device 110 according to an embodiment of the disclosure programs selection transistors through a pre-program and a main program. Each of the pre-program and the main program is performed for each matrix of the memory blocks BLK1 to BLKz sharing a set of bit lines BL1 to BL4 or for each set of the bit lines BL1 to BL4. The pre-program is performed on all the memory blocks BLK1 to BLKz that share the set of bit lines BL1 to BL4. The pre-program is performed to increase threshold voltages of selection transistors to such an extent that the selection transistors are turned off by the turn-off voltage. The main program is performed after the pre-program is completed.

The main program is performed on all the memory blocks BLK1 to BLKz that share the set of bit lines BL1 to BL4. The main program is performed to adjust threshold voltages of selection transistors to a target level or higher.

In an embodiment, two or more matrices may be provided in the memory cell array 111. Each matrix may include a plurality of memory blocks. The memory blocks of each matrix share bit lines, and the memory blocks of different matrices do not share bit lines. For example, memory blocks of a first matrix may share a first bit line set and may share a second bit line set that do not overlap with a first bit line set of memory blocks of a second matrix. When two or more matrices are provided, program operations of selection transistors of different matrices may be performed independently of each other. For example, the pre-program or the main program may be performed in the second matrix regardless of whether the pre-program or the main program is performed on selection transistors of the first matrix. In each matrix, the main program may be performed after the pre-program is performed.

Figure 4:
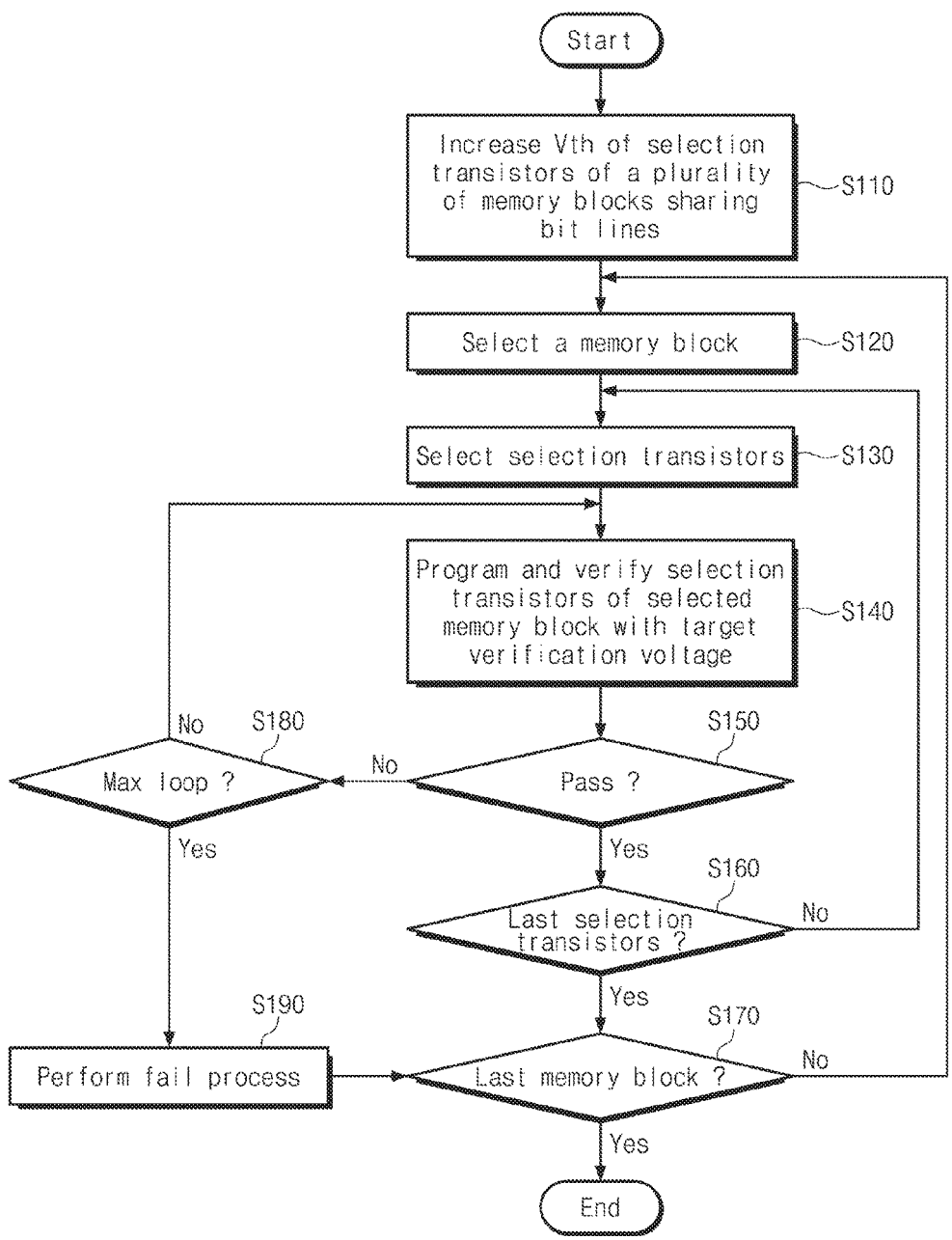
FIG. 4 is a flowchart illustrating an operating method of a nonvolatile memory device, according to an embodiment of the disclosure.

FIG. 4 is a flowchart illustrating an operating method of the nonvolatile memory device 110, according to an embodiment of the disclosure. Referring to FIGS. 1 and 4, in operation S110, the pre-program is performed to increase threshold voltages Vth of selection transistors of all the memory blocks BLK1 to BLKz that share bit lines. If the pre-program is performed, threshold voltages of the selection transistors (string selection transistors or ground selection transistors) of the memory blocks BLK1 to BLKz may increase to such an extent as to be turned off by the turn-off voltage. After the pre-program is completed on each of the memory blocks BLK1 to BLKz, the main program is performed in operation S120 to operation S190.

In operation S120, one memory block of the memory blocks BLK1 to BLKz is selected. In operation S130, selection transistors of the selected memory block that are a program target are selected. For example, selection transistors (string selection transistors or ground selection transistors) of the selected memory block that are connected to one selection line (a string selection line or a ground selection line) may be selected as the program target. As another example, selection transistors connected to two or more selection lines may be simultaneously selected as the program target. As another example, all string selection transistors or all ground selection transistors of the selected memory block may be simultaneously selected as the program target.

In operation S140, the control logic circuit 116 controls the row decoder circuit 112 and the page buffer circuit 113 to program the selection transistors of the selected memory block and verify the programmed selection transistors by using a target verification voltage. For example, when the program target corresponds to two or more selection lines, selection transistors of the two or more selection lines may be simultaneously programmed. The selection transistors of the two or more selection lines may be verified for each selection line or may be verified at the same time.

For example, voltage parameters for string selection transistors may be different from voltage parameters for ground selection transistors. For example, the voltage parameters may include a program start voltage to be applied to selection transistors of a program target in a first program loop, an increment of a program voltage at an iteration of program loops, a verification voltage to be applied to the selection transistors of the program target in verification, and the maximum number of program loops, etc.

In operation S150, whether the selection transistors are successfully programmed (pass) is determined according to the verification result. For example, if the number of selection transistors, of which the threshold voltages are lower than the verification voltage, of memory cells of the program target, that is, the number of on-cells is not more than a reference value, program pass is determined, and the process proceeds to operation S160. If the number of on-cells is greater than the reference value, the process proceeds to operation S180.

In operation S160, whether the programmed and verified selection transistors are the last selection transistors of the selected memory block is determined. If the programmed and verified selection transistors are the last selection transistors of the selected memory block, the process proceeds to operation S170. If the programmed and verified selection transistors are not the last selection transistors of the selected memory block, other selection transistors of the memory block selected in operation S130 are selected as the program target.

In operation S170, whether the selected memory block is the last memory block of the memory blocks BLK1 to BLKz is determined. If the selected memory block is not the last memory block, a next memory block is selected in operation S120. If the selected memory block is the last memory block, programming of the selection transistors ends.

If program fail is determined in operation S150, the process proceeds to operation S180. In operation S180, whether a program loop is the maximum loop is determined. The maximum loop indicates a limit by which the program loop is repeated and may be set upon manufacturing the nonvolatile memory device 110 or by an external device. If the program loop is not the maximum loop, the program voltage increases, and the process proceeds to operation S140, in which the same selection transistors are programmed and verified. If the program loop is the maximum loop, in operation S190, program fail is determined, and a fail process is performed. For example, the fail process may include classifying the selected memory block as a bad block. Afterwards, operation S170 is performed.

In an embodiment, in the selected memory block, the main program of ground selection transistors (or string selection transistors) may be performed after the main program of string selection transistors (or ground selection transistors) is completed. As another embodiment, in a plurality of memory blocks, the main program of ground selection transistors (or string selection transistors) may be performed after the main program of string selection transistors (or ground selection transistors) is completed. In this case, after operation S120 to operation S190 are performed on string selection transistors (or ground selection transistors), operation S120 to operation S190 are performed on the ground selection transistors (or the string selection transistors).

Figure 5:
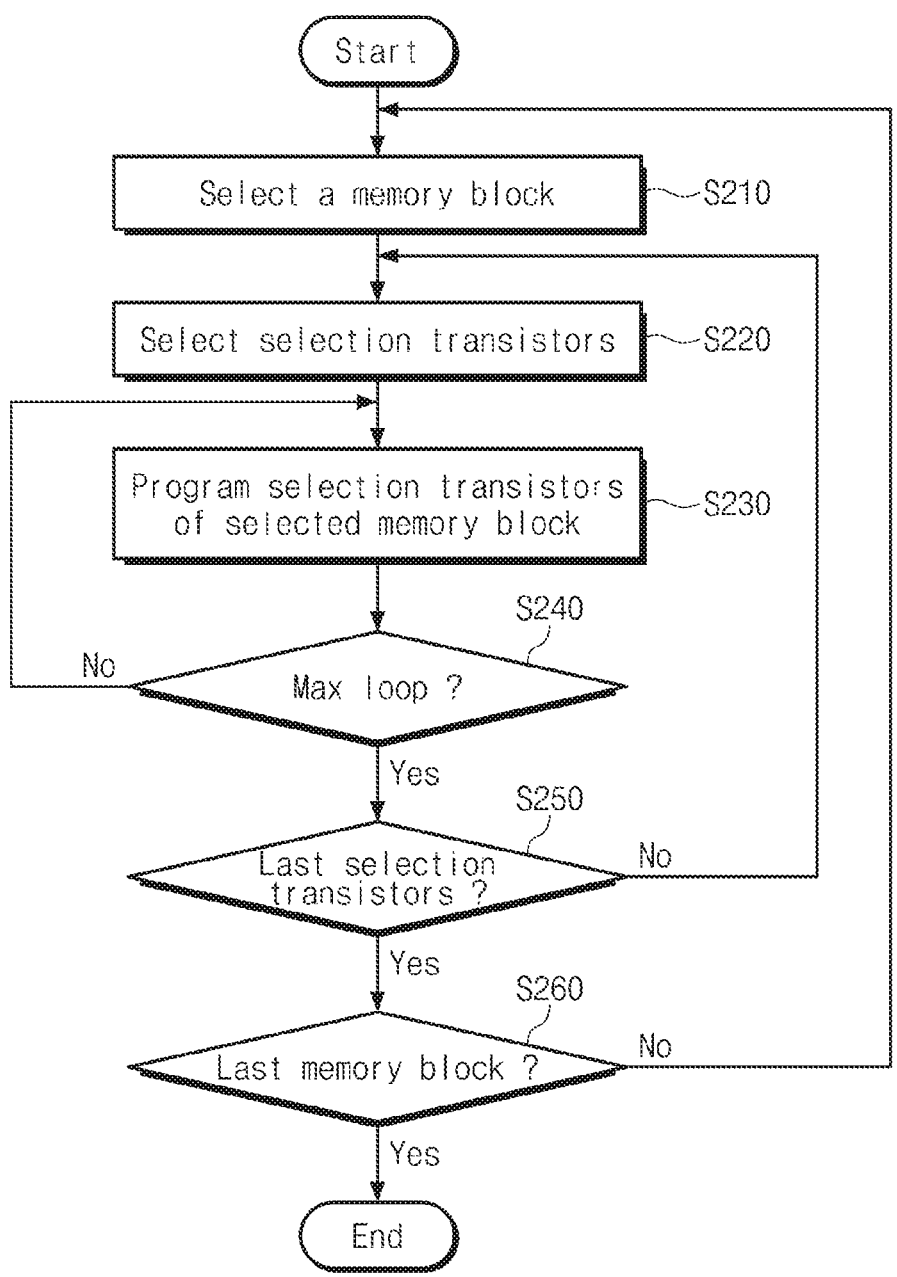
FIG. 5 is a flowchart illustrating an example of a pre-program, according to an embodiment of the disclosure.

FIG. 5 is a flowchart illustrating an example of pre-program, according to an embodiment of the disclosure. Referring to FIGS. 1 and 5, in operation S210, one memory block of the memory blocks BLK1 to BLKz is selected. In operation S220, selection transistors of the selected memory block that are a program target are selected. For example, selection transistors (string selection transistors or ground selection transistors) of the selected memory block that are connected to one selection line (a string selection line or a ground selection line) may be selected as a program target. As another example, selection transistors connected to two or more selection lines may be simultaneously selected as the program target. As another example, all string selection transistors or all ground selection transistors of the selected memory block may be simultaneously selected as the program target.

In operation S230, the control logic circuit 116 controls the row decoder circuit 112 and the page buffer circuit 113 to program the selection transistors of the selected memory block. The selection transistors may be programmed without verification. For example, selection transistors (string selection transistors or ground selection transistors) of the selected memory block, which are connected to one selection line (a string selection line or a ground selection line), may be programmed. As another example, selection transistors connected to two or more selection lines may be simultaneously programmed. As another example, string selection transistors or ground selection transistors of the selected memory block may be simultaneously programmed. For example, voltage parameters for string selection transistors may be different from voltage parameters for ground selection transistors.

In operation S240, whether a program loop is the maximum loop is determined. The maximum loop indicates a limit by which the program loop is repeated and may be set upon manufacturing the nonvolatile memory device 110 or by an external device. The maximum loop of the pre-program may be smaller than the maximum loop of the main program. If the program loop is not the maximum loop, the program voltage increases, and the process proceeds to operation S230, in which the same selection transistors are programmed. If the program loop is the maximum loop, the process proceeds to operation S250.

In operation S250, whether the programmed selection transistors are the last selection transistors of the selected memory block is determined. If the programmed selection transistors are the last selection transistors of the selected memory block, the process proceeds to operation S260. If the programmed selection transistors are not the last selection transistors of the selected memory block, other selection transistors of the memory block selected in operation S220 are selected as the program target.

In operation S260, whether the selected memory block is the last memory block of the memory blocks BLK1 to BLKz is determined. If the selected memory block is not the last memory block, another memory block is selected in operation S210. If the selected memory block is the last memory block, programming of the selection transistors ends.

In an embodiment, in the selected memory block, the pre-program of ground selection transistors (or string selection transistors) may be performed after the pre-program of string selection transistors (or ground selection transistors) is completed. As another embodiment, in a plurality of memory blocks, the pre-program of ground selection transistors (or string selection transistors) may be performed after the pre-program of string selection transistors (or ground selection transistors) is completed. In this case, after operation S210 to operation S260 are performed on string selection transistors (or ground selection transistors), operation S210 to operation S260 are performed on the ground selection transistors (or the string selection transistors).

As described with reference to FIG. 5, the pre-program includes applying a program voltage to selection transistors of a program operation target by a given frequency (e.g., maximum loop) without verification. Threshold voltages of the selection transistors corresponding to the program target may be adjusted to be higher than the turn-off voltage by applying the program voltage by the given frequency.

For example, a program start voltage of the pre-program may be lower than a program start voltage of the main program. An increment of a program voltage of the pre-program may be greater than an increment of a program voltage of the main program.

Figure 6:
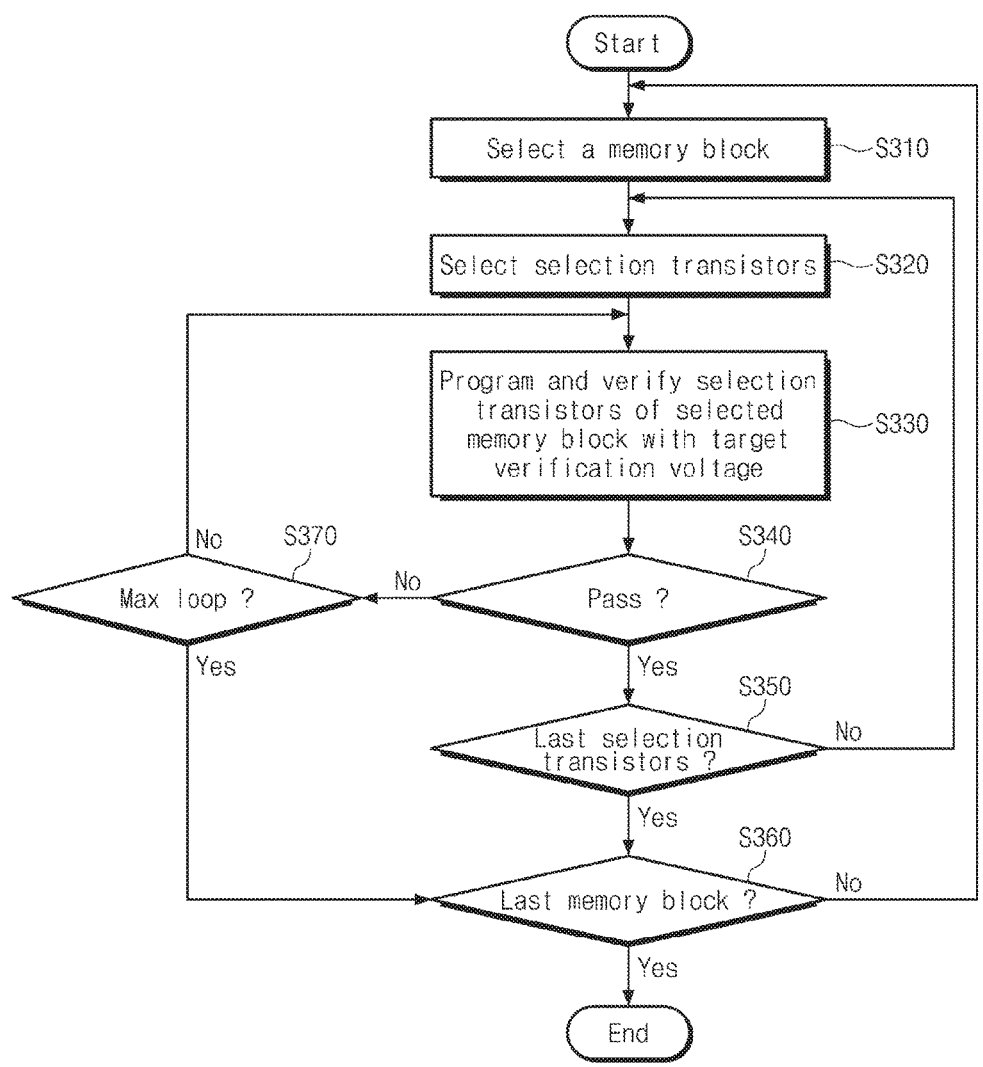
FIG. 6 shows another example of the pre-program, according to an embodiment of the disclosure.

FIG. 6 shows another example of a pre-program, according to an embodiment of the disclosure. Operation S310, operation S320, and operation S340 to operation S370 of FIG. 6 are performed the same as operation S210, operation S220, and operation S240 to operation S270 of FIG. 5, and a description thereof is thus omitted.

In operation S330, the control logic circuit 116 controls the row decoder circuit 112 and the page buffer circuit 113 to program selection transistors of the selected memory block, which are selected as a program target, and verify the programmed selection transistors by using a verification voltage. For example, selection transistors (string selection transistors or ground selection transistors) of the selected memory block, which are connected to one selection line (a string selection line or a ground selection line), may be programmed and verified. As another example, selection transistors connected to two or more selection lines may be verified simultaneously or sequentially after being simultaneously programmed. As another example, string selection transistors or ground selection transistors of the selected memory block may be simultaneously programmed. For example, voltage parameters for string selection transistors may be different from voltage parameters for ground selection transistors.

As described with reference to FIG. 5, verification may be performed in the pre-program. Selection transistors that are verify passed may be program inhibited in a next program loop. For example, selection transistors that are verify passed may be program inhibited by applying a program inhibition voltage to a corresponding bit line. Even though verification of selection transistors corresponding to the program target is not successfully (verify fail), that is, even though selection transistors, of which the threshold voltages are lower than the verification voltage exist, the pre-program may end if a program loop is the maximum loop. For example, the pre-program may be identified without a fail process as being completed normally.

For example, the verification voltage of the pre-program may be lower than the verification voltage of the main program.

Figure 7:
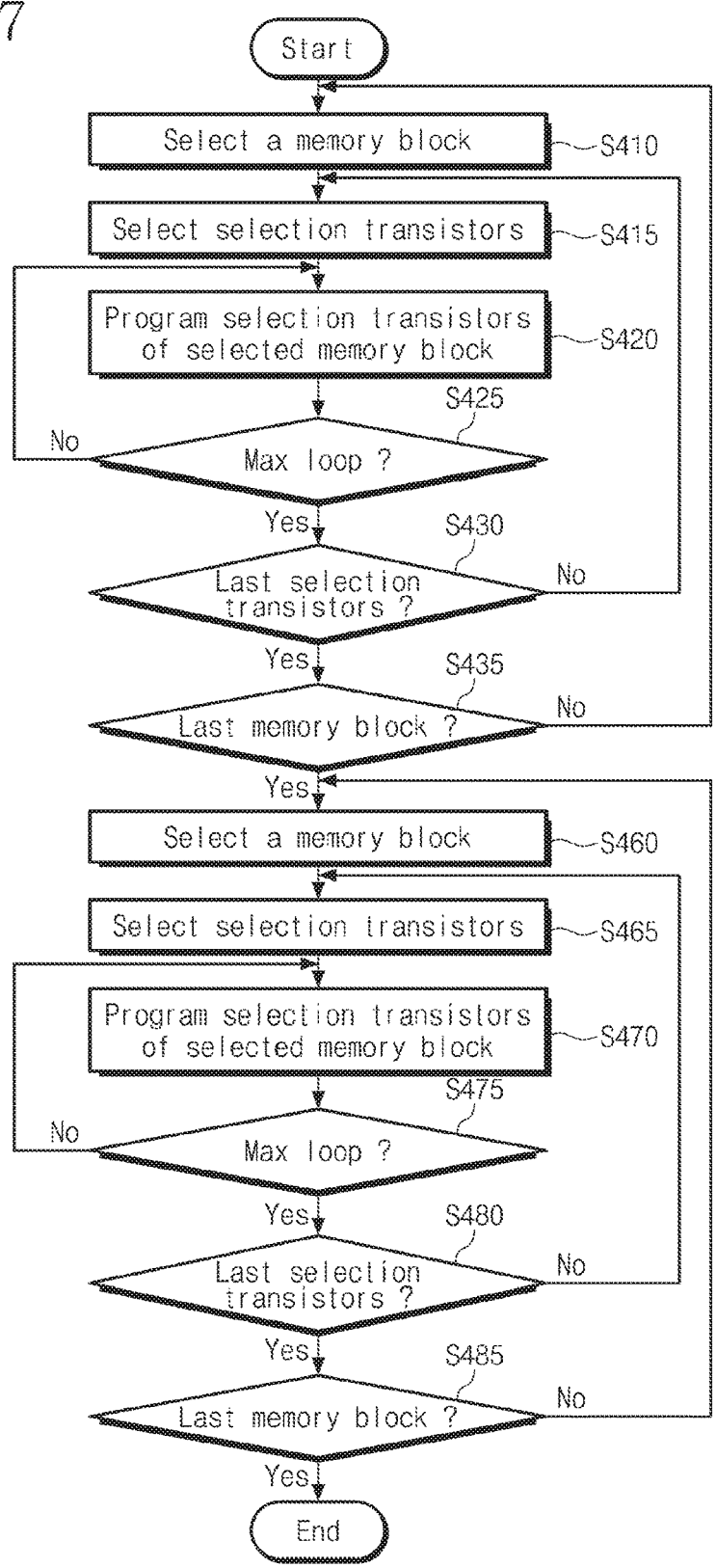
FIG. 7 shows an example of the pre-program, according to another embodiment of the disclosure.

FIG. 7 shows an example of a pre-program, according to another embodiment of the disclosure. Referring to FIGS. 1, 5, and 7, operation S410 to operation S435 are the same as operation S210 to operation S260 of FIG. 5. Also, operation S460 to operation S485 are the same as operation S210 to operation S260 of FIG. 5. That is, in an embodiment of FIG. 7, the pre-program may include two or more program operations. Each program operation includes repeating a program loop by the maximum loop without verification as described with reference to FIG. 5. A program start voltage of a first program operation (operation S410 to operation S435) may be lower than a program start voltage of a second program operation (operation S460 to operation S465). An increment of a program voltage of the first program operation (operation S410 to operation S435) may be greater than an increment of a program voltage of the second program operation (operation S460 to operation S465). The maximum loop of the first program operation (operation S410 to operation S435) may be equal to or smaller than the maximum loop of the second program operation (operation S460 to operation S465).

Figure 8:
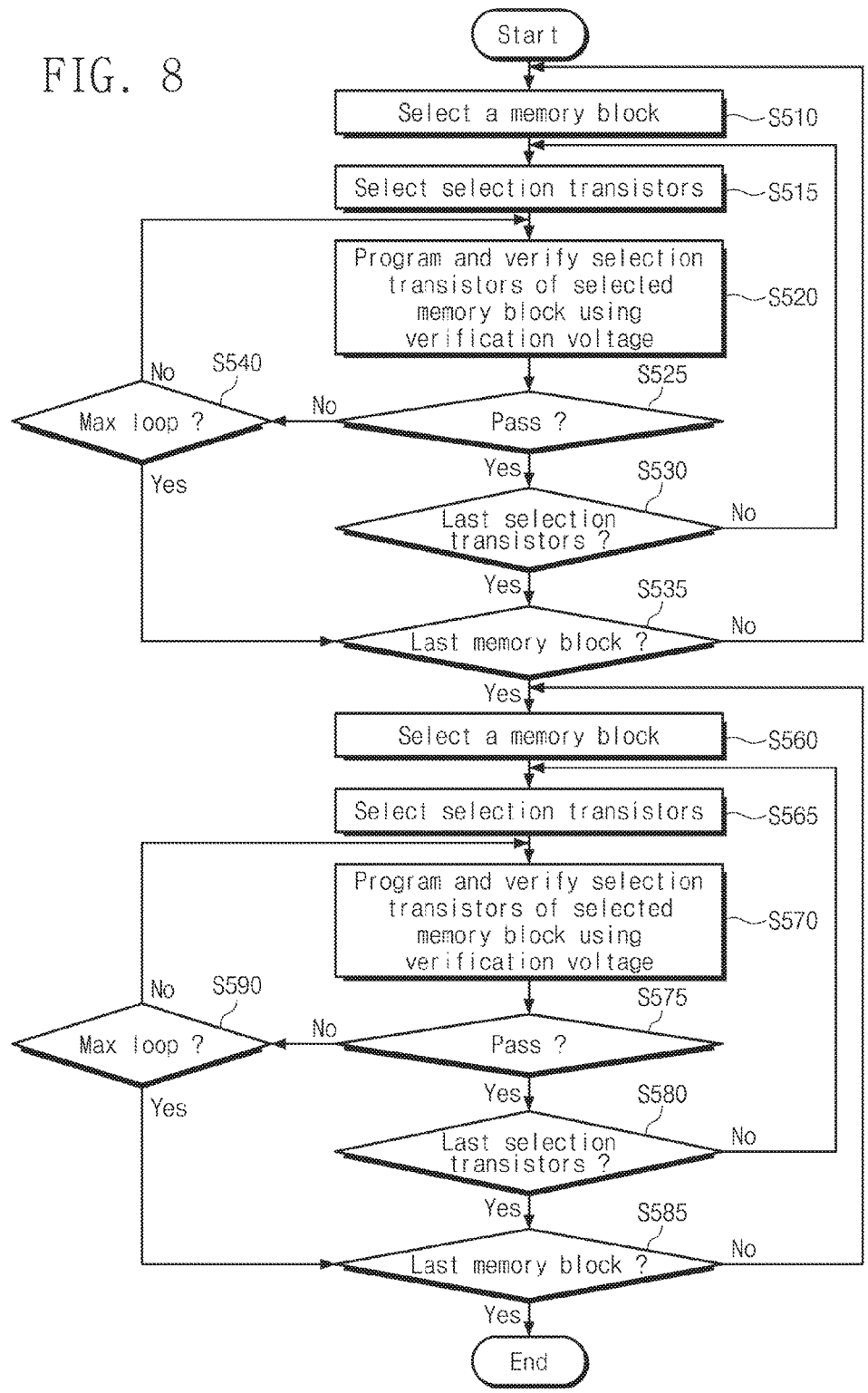
FIG. 8 shows an example of the pre-program, according to another embodiment of the disclosure.

FIG. 8 shows an example of a pre-program, according to another embodiment of the disclosure. Referring to FIGS. 1, 6, and 8, operation S510 to operation S540 are the same as operation S310 to operation S370 of FIG. 6. Also, operation S560 to operation S590 are the same as operation S310 to operation S370 of FIG. 6. That is, in an embodiment of FIG. 8, the pre-program may include two or more program operations. Each program operation includes repeating a program loop, in which selection transistors corresponding to a program target are programmed and verified, by the maximum loop as described with reference to FIG. 6. A program start voltage and a verification voltage of a first program operation (operation S510 to operation S540) may be lower than a program start voltage and a verification voltage of a second program operation (operation S560 to operation S590). An increment of a program voltage of the first program operation (operation S510 to operation S540) may be greater than an increment of a program voltage of the second program operation (operation S560 to operation S590). The maximum loop of the first program operation (operation S510 to operation S540) may be equal to or smaller than the maximum loop of the second program operation (operation S560 to operation S590).

Figure 9:
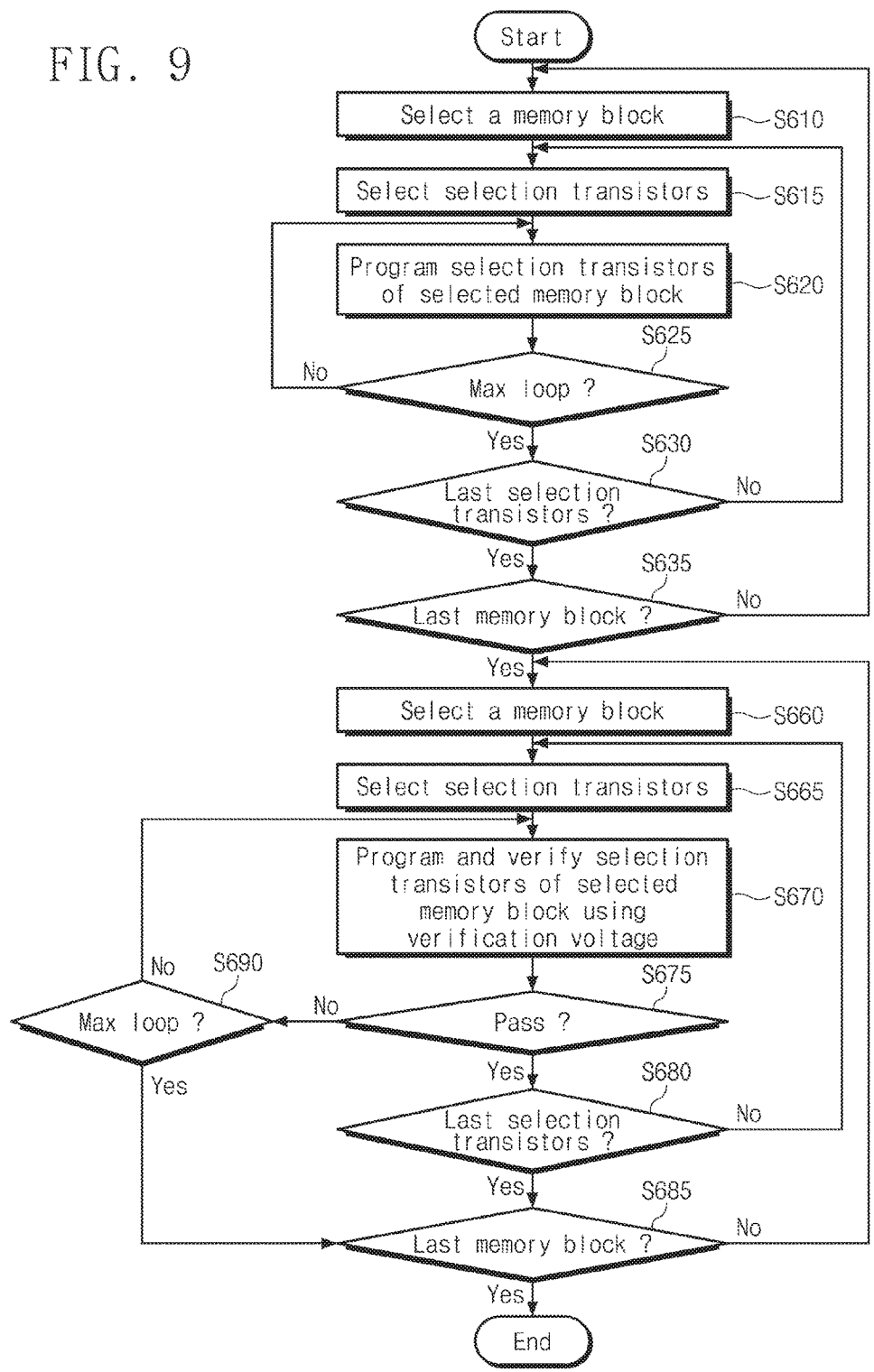
FIG. 9 shows an example of the pre-program, according to another embodiment of the disclosure.

FIG. 9 shows an example of a pre-program, according to another embodiment of the disclosure. Referring to FIGS. 1, 5, 6, and 9, operation S610 to operation S635 are the same as operation S210 to operation S260 of FIG. 5. Also, operation S660 to operation S690 are the same as operation S310 to operation S370 of FIG. 6. That is, in an embodiment of FIG. 9, the pre-program may include two or more program operations. At least one of the two or more program operations includes repeating a program loop by the maximum loop without verification as described with reference to FIG. 5. At least another of the two or more program operations includes repeating a program loop, in which selection transistors corresponding to a program target are programmed and verified, by the maximum loop as described with reference to FIG. 6. A program start voltage of a first program operation (operation S610 to operation S635) may be lower than a program start voltage of a second program operation (operation S660 to operation S690). An increment of a program voltage of the first program operation (operation S610 to operation S635) may be greater than an increment of a program voltage of the second program operation (operation S660 to operation S690). The maximum loop of the first program operation (operation S610 to operation S635) may be equal to or smaller than the maximum loop of the second program operation (operation S660 to operation S690).

In FIG. 9, the pre-program is described as performing a program operation of FIG. 6 after performing a program operation of FIG. 5. However, the pre-program may be modified or changed as performing the program operation of FIG. 5 after performing the program operation of FIG. 6.

FIG. 10 shows an option table OT of options for programming selection transistors and a scheme table ST in which the options are combined. Referring to FIGS. 1 and 10, the option table OT includes a first option "A", a second option "B", a third option "C", and a fourth option "D". The first option "A" includes the pre-program of string selection transistors SST of the memory blocks BLK1 to BLKz. The second option "B" includes the pre-program of ground selection transistors GST of the memory blocks BLK1 to BLKz. The third option "C" includes the main program of the string selection transistors SST of the memory blocks BLK1 to BLKz. The fourth option "D" includes the main-program of the ground selection transistors GST of the memory blocks BLK1 to BLKz.

Referring to the scheme table ST, the nonvolatile memory device 110 may perform a program operation of selection transistors based on first to fifth schemes. In the first scheme, the nonvolatile memory device 110 may perform the pre-program on the selection transistors once and may perform the main program on the selection transistors once. The nonvolatile memory device 110 may perform the first option "A" and the second option "B" without an order. The nonvolatile memory device 110 may perform the first option "A" and the second option "B" regardless of an order. That is, the nonvolatile memory device 110 may perform the main program (e.g., option "C" followed by option "D", or vice versa) after completing the pre-program of selection transistors.

In the second scheme, the nonvolatile memory device 110 may sequentially perform the pre-program (the first option "A") and the main program (the third option "C") of the string selection transistors SST and may sequentially perform the pre-program (the second option "B") and the main program (the fourth option "D") of the ground selection transistors GST. Alternatively, the nonvolatile memory device 110 may sequentially perform the pre-program (the second option "B") and the main program (the fourth option "D") of the ground selection transistors GST and may sequentially perform the pre-program (the first option "A") and the main program (the third option "C") of the string selection transistors SST.

In the third scheme, the nonvolatile memory device 110 may perform the pre-program on the selection transistors two times and may perform the main program on the selection transistors once. The nonvolatile memory device 110 may perform the first option "A" and the second option "B" without an order. After performing the first option "A" and the second option "B", the nonvolatile memory device 110 may perform the first option "A" and the second option "B" once more regardless of an order. After performing the first option "A" and the second option "B" once more, the nonvolatile memory device 110 may perform the third option "C" and the fourth option "D" regardless of an order. That is, the nonvolatile memory device 110 may perform second main program after performing first pre-program of selection transistors and may perform the main program after performing second pre-program.

In the fourth scheme, the nonvolatile memory device 110 may perform the pre-program (the second option "B") of the ground selection transistors GST two times after performing the pre-program (the first option "A") of the string selection transistors SST two times. Alternatively, the nonvolatile memory device 110 may perform the pre-program (the first option "A") of the string selection transistors SST two times after performing the pre-program (the second option "B") of the ground selection transistors GST two times. Afterwards, the nonvolatile memory device 110 may perform the main programs (the third option "C" and the fourth option "D") of selection transistors regardless of an order.

In the fifth scheme, the nonvolatile memory device 110 may perform the pre-programs (the second option "B") and the main program (the fourth option "D") of the ground selection transistors GST after completing the pre-programs (the first option "A") and the main program (the third option "C") of string ground selection transistors SST. Alternatively, the nonvolatile memory device 110 may perform the pre-programs (the first option "A") and the main program (the third option "C") of the string selection transistors SST after completing the pre-programs (the second option "B") and the main program (the fourth option "D") of the ground selection transistors GST.

In short, the main program is performed after the pre-program of selection transistors situated at the same height (refer to FIG. 2) in the memory blocks BLK1 to BLKz is completed. When the pre-program includes two or more program operations, the second pre-program is performed after the first pre-program of selection transistors situated at the same height in the memory blocks BLK1 to BLKz is each completed. In the above-described condition, the first option "A", the second option "B", the third option "C", and the fourth option "D" may be variously combined without being limited to combinations of the scheme table ST.

The selection transistor programming method described with reference to FIGS. 1 to 10 may be generally performed in a test step after the nonvolatile memory device 110 is manufactured. However, the selection transistor programming method described with reference to FIGS. 1 to 10 may be performed under control of an external device (e.g., a controller of FIG. 11) after the nonvolatile memory device 110 is manufactured and tested.

Figure 11:
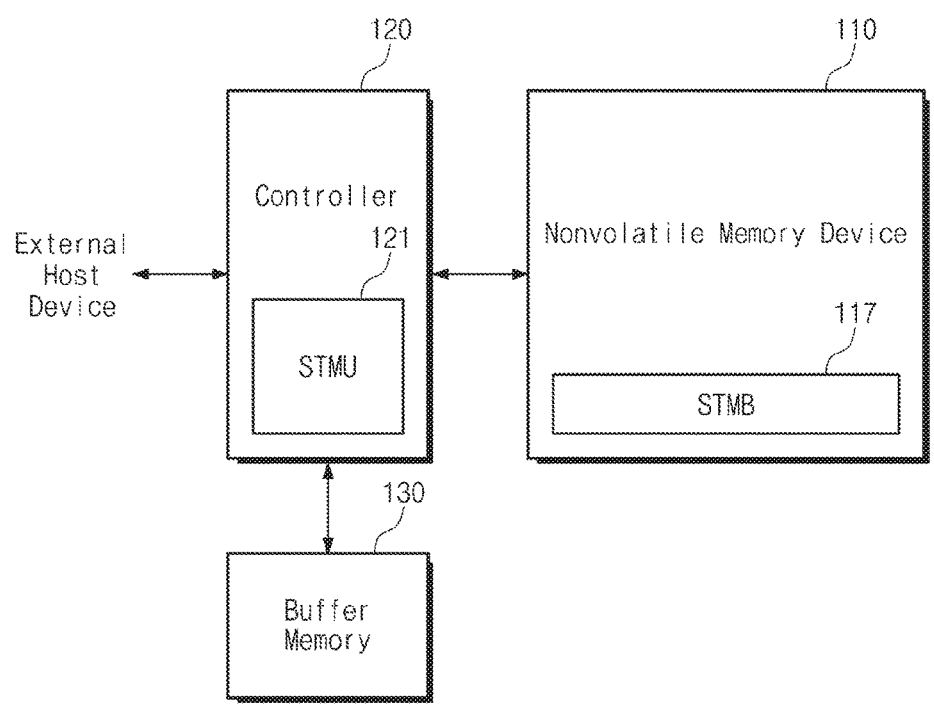
FIG. 11 is a block diagram illustrating a storage device, according to an embodiment of the disclosure.

FIG. 11 is a block diagram illustrating a storage device 100, according to an embodiment of the disclosure. Referring to FIG. 11, the storage device 100 includes the nonvolatile memory device 110, the controller 120, and a buffer memory 130.

The nonvolatile memory device 110 may perform a write operation, a read operation, and an erase operation under control of the controller 120. The nonvolatile memory device 110 may receive a write command, an address, and data from the controller 120 and may write the data in a storage space corresponding to the address. The nonvolatile memory device 110 may receive a read command and an address from the controller 120, may read data from a storage space corresponding to the address, and may output the read data to the controller 120. The nonvolatile memory device 110 may receive an erase command and an address from the controller 120 and may erase data of a storage space corresponding to the address.

For example, the nonvolatile memory device 110 may have the same structure and manner as those described with reference to FIGS. 1 to 10. For example, the nonvolatile memory device 110 may include the selection transistor managing block 117 and may program selection transistors in units of a matrix under control of the selection transistor managing block 117.

The controller 120 may access the nonvolatile memory device 110 and the buffer memory 130. The controller 120 may perform a write operation, a read operation, and an erase operation in response to a request of an external host device (not illustrated). The controller 120 may write write-requested data in the nonvolatile memory device 110 and may read read-requested data from the nonvolatile memory device 110 to output the read data to the external host device.

The controller 120 may manage the storage device 100 by using the buffer memory 130. For example, the controller 120 may temporarily store data to be written in the nonvolatile memory device 110 or data read from the nonvolatile memory device 110 in the buffer memory 130. The controller 120 may load metadata, which is needed to manage the nonvolatile memory device 110, on the buffer memory 130.

The controller 120 includes a selection transistor managing unit (STMU) 121. The selection transistor managing unit 121 may adjust various options or parameters that are used when the nonvolatile memory device 110 programs selection transistors.

In an embodiment, the controller 120 may adjust modes of the memory blocks BLK1 to BLKz based on the degree of wear-out or degradation of the memory blocks BLK1 to BLKz. When the controller 120 adjusts the modes of the memory blocks BLK1 to BLKz, the controller 120 may request the nonvolatile memory device 110 to adjust threshold voltages of selection transistors so as to correspond to the adjusted modes. For example, if there is a need to increase threshold voltages of selection transistors of each memory block due to a mode change, the controller 120 may request the nonvolatile memory device 110 to increase the threshold voltages of the selection transistors through an additional program operation. If there is a need to decrease threshold voltages of selection transistors of each memory block due to a mode change, the controller 120 may request the nonvolatile memory device 110 to decrease the threshold voltages of the selection transistors through an erase operation and to then increase threshold voltages of the selection transistors through a program operation. An erase verification voltage that is used when selection transistors are erased may be equal to or higher than an erase verification voltage that is used when memory cells are erased. For example, a range of threshold voltages of erased selection transistors may be equal to or higher than a range of threshold voltages of erased memory cells.

Figure 12:
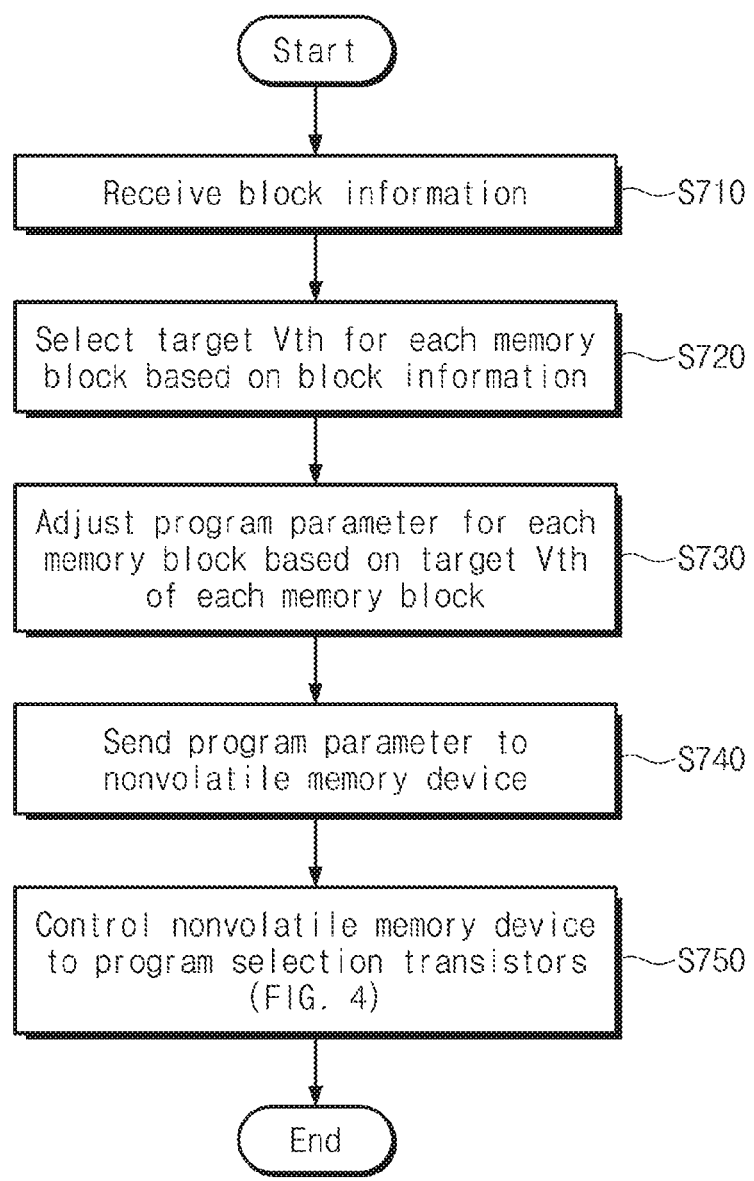
FIG. 12 is a flowchart illustrating an example in which the storage device adjusts a program option of selection transistors, according to an embodiment of the disclosure.

FIG. 12 is a flowchart illustrating an example in which the storage device 100 adjusts a program option of selection transistors, according to an embodiment of the disclosure. Referring to FIGS. 1, 11, and 12, in operation S710, the controller 120, in more detail, the selection transistor managing unit 121 may receive block information. For example, the block information may be information that has an influence on threshold voltages of selection transistors or is affected by the threshold voltages of the selection transistors. The block information may be received from the external host device or may be determined according to an internal policy of the controller 120. The block information may include information about whether each of the memory blocks BLK1 to BLKz operates in any mode of a single level cell (SLC) mode, a multi-level cell (MLC) mode, a triple level cell (TLC), a quadruple level cell (QLC) mode, and a mode of a level higher than the QLC mode.

In operation S720, the selection transistor managing unit 121 may select a target threshold voltage Vth for each memory block based on the block information. For example, a higher target threshold voltage may be selected as each memory block operates in a mode of a higher level. A lower target threshold voltage may be selected as each memory block operates in a mode of a lower level.

In operation S730, the selection transistor managing unit 121 may adjust a program parameter of each memory block based on the target threshold voltage of each memory block. For example, as the target threshold voltage of each memory block becomes higher, a program start voltage or a verification voltage of the pre-program or main program associated with selection transistors may be adjusted to be higher. As the target threshold voltage of each memory block becomes lower, the program start voltage or the verification voltage of the pre-program or main program associated with the selection transistors may be adjusted to be lower.

In operation S740, the selection transistor managing unit 121 may send the adjusted program parameters to the nonvolatile memory device 110, in more detail, the selection transistor managing block 117.

In operation S750, the selection transistor managing unit 117 may control the nonvolatile memory device 110 to program selection transistors in the method described with reference to FIG. 4.

An embodiment is exemplified in which the controller 120 sends the program parameters adjusted according to the target threshold voltage to the nonvolatile memory device 110. However, the controller 120 may send information about the target threshold voltage of each memory block to the nonvolatile memory device 110. The nonvolatile memory device 110 may adjust a program parameter of each memory block based on information of the target threshold voltage of each memory block and may perform the pre-program and the main program of selection transistors based on the adjusted parameter. As another example, the controller 120 may send the block information to the nonvolatile memory device 110. The nonvolatile memory device 110 may select a target threshold voltage of each memory block based on the block information, may adjust a program parameter of each memory block based on the target threshold voltage of each memory block, and may perform the pre-program and the main program of selection transistors based on the adjusted parameter.

FIG. 13 is a flowchart illustrating an example in which the storage device 110 determines whether to perform a program option of selection transistors, according to an embodiment of the disclosure. Referring to FIGS. 1, 11, and 13, in operation S910, the controller 120, in more detail, the selection transistor managing unit 121 may control the nonvolatile memory device 110 to check threshold voltages Vth of selection transistors.

In an embodiment, environment noise or disturbance generated in an erase operation, a program operation, and a read operation performed in the memory blocks BLK1 to BLKz may make threshold voltages of selection transistors high or low. If the threshold voltages of the selection transistors leave a normal range, the selection transistors may be turned off at turn-on timing or may be turned on at turn-off timing. Accordingly, the selection transistor managing unit 121 may control the nonvolatile memory device 110 to check threshold voltages of the selection transistors periodically, at an idle time, or when a program, read, or erase error is generated.

For example, the nonvolatile memory device 110 may perform the read operation by using one read level. That is, the selection transistor managing block 121 may determine whether threshold voltages of the selection transistors are lower than the read level or higher than the read level. The nonvolatile memory device 110 may perform the read operation by using two read levels. That is, the selection transistor managing block 121 may determine whether threshold voltages of the selection transistors belong to a range defined by the two read levels or leave the range. For example, the selection transistor managing unit 121 may randomly select one or more of the memory blocks BLK1 to BLKz or may select a memory block, in which an error is generated, of the memory blocks BLK1 to BLKz. The selection transistor managing unit 121 may control the nonvolatile memory device 110 to check threshold voltages of all or some of selection transistors of the selected memory block.

In operation S920, the selection transistor managing unit 121 may determine whether threshold voltages of the checked selection transistors are within a target range. For example, when threshold voltages of the checked selection transistors are lower than a read level, when threshold voltages of the checked selection transistors are higher than the read level, or when threshold voltages of the checked selection transistors are within a range defined by read levels, the selection transistor managing unit 121 may determine that the threshold voltages of the checked selection transistors are within the target range. If the threshold voltages of the checked selection transistors are within the target range, the process ends.

If the threshold voltages of the checked selection transistors are not within the target range, the process proceeds to operation S930. In operation S930, the controller 120 may control the nonvolatile memory device 110 to program selection transistors in the method described with reference to FIG. 4.

According to embodiments of the disclosure, threshold voltages of selection transistors may be concentrated within a target range. Accordingly, it may be possible to provide a nonvolatile memory device with improved reliability and a storage device including the nonvolatile memory device.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A nonvolatile memory device comprising:
a memory cell array comprising a plurality of memory blocks, each of which comprises a plurality of cell strings each comprising a ground selection transistor, a plurality of memory cells, and a string selection transistor;
a row decoder circuit connected to the ground selection transistors, memory cells, and string selection transistors of each memory block through ground selection lines, word lines, and string selection lines;
a page buffer circuit connected to the string selection transistors of the cell strings of each memory block through a plurality of bit lines; and
a control logic circuit configured to control the row decoder circuit and the page buffer circuit to: (1) perform a pre-program of programming the string selection transistors or the ground selection transistors of a selected memory block while sequentially selecting each of the plurality of memory blocks and (2) perform, after the pre-program is completed, a main program of programming the string selection transistors or the ground selection transistors of the selected memory block and performing verification of the programming of the string selection transistors or the ground selection transistors of the selected memory block by using a first verification voltage while sequentially selecting each of the plurality of memory blocks.

2. The nonvolatile memory device of claim 1, wherein two or more string selection transistors, among the string selection transistors, or two or more ground selection transistors, among the ground selection transistors, are simultaneously programmed in the selected memory block during the main program.

3. The nonvolatile memory device of claim 1, wherein the string selection transistors or the ground selection transistors of the selected memory block are simultaneously programmed during the pre-program without verification of the programming being achieved through application of a verification voltage to the string selection transistors or the ground selection transistors of the selected memory block.

4. The nonvolatile memory device of claim 1, wherein the string selection transistors or the ground selection transistors of the selected memory block are repeatedly programmed a specific number of times during the pre-program.

5. The nonvolatile memory device of claim 1, wherein during the pre-program, the string selection transistors or the ground selection transistors of the selected memory block are programmed and are then verified by using a second verification voltage.

6. The nonvolatile memory device of claim 5, wherein:
the pre-program ends if a verification result using the second verification voltage indicates pass, and
the pre-program ends if the string selection transistors or the ground selection transistors of the selected memory block are repeatedly programmed a specific number of times even though the verification result using the second verification voltage indicates fail.

7. The nonvolatile memory device of claim 1, wherein:
the pre-program and the main program repeatedly program the string selection transistors or the ground selection transistors of the selected memory block while increasing a program voltage stepwise,
a program start voltage of the pre-program is lower than a program start voltage of the main program, and
an increment of the program voltage of the pre-program is greater than an increment of the program voltage of the main program.

8. The nonvolatile memory device of claim 7, wherein:
during the pre-program and the main program, the string selection transistors or the ground selection transistors of the selected memory block are programmed and are then verified, and
a verification voltage of the pre-program is lower than a verification voltage of the main program.

9. The nonvolatile memory device of claim 1, wherein:
the pre-program comprises a first pre-program and a second pre-program,
the first pre-program programs the string selection transistors or the ground selection transistors of the selected memory block without verification or while performing verification by using a second verification voltage, and
after the first pre-program on the plurality of memory blocks is completed, the second pre-program programs the string selection transistors or the ground selection transistors of the selected memory block without verification or while performing verification by using a third verification voltage.

10. The nonvolatile memory device of claim 9, wherein:
the first pre-program and the second pre-program repeatedly program the string selection transistors or the ground selection transistors of the selected memory block while increasing a program voltage stepwise,
a program start voltage of the first pre-program is lower than a program start voltage of the second pre-program,
an increment of the program voltage of the first pre-program is greater than an increment of the program voltage of the second pre-program, and
the second verification voltage is lower than the third verification voltage.

11. The nonvolatile memory device of claim 1, wherein the control logic circuit controls the row decoder circuit and the page buffer circuit to perform the main program on the string selection transistors and the ground selection transistors of the plurality of memory blocks after completing the pre-program on the string selection transistors and the ground selection transistors of the plurality of memory blocks.

12. The nonvolatile memory device of claim 1, wherein the control logic circuit controls the row decoder circuit and the page buffer circuit to perform the pre-program and the main program on the ground selection transistors of the plurality of memory blocks after completing the pre-program and the main program on the string selection transistors of the plurality of memory blocks.

13. A storage device comprising:
a nonvolatile memory device comprising a plurality of memory blocks, each of which comprises a plurality of cell strings each comprising a ground selection transistor, a plurality of memory cells, and a string selection transistor; and
a controller configured to control the nonvolatile memory device, wherein
the nonvolatile memory device: (1) performs a pre-program of programming the string selection transistors or the ground selection transistors of a selected memory block while sequentially selecting each of the plurality of memory blocks and (2) performs, after the pre-program is completed, a main program of programming the string selection transistors or the ground selection transistors of the selected memory block and performing verification of the programming of the string selection transistors or the ground selection transistors of the selected memory block by using a verification voltage while sequentially selecting each of the plurality of memory blocks.

14. The storage device of claim 13, wherein the controller classifies the plurality of memory blocks into two or more types, adjusts a program parameter of each memory block based on a classification result, sends the program parameter to the nonvolatile memory device, and controls the nonvolatile memory device to perform the pre-program and the main program based on the program parameter.

15. The storage device of claim 13, wherein:
the controller controls the nonvolatile memory device to check threshold voltages of string the selection transistors or the ground selection transistors of all or some of the plurality of memory blocks, and
when at least some of the checked threshold voltages are lower than a target threshold voltage, the controller controls the nonvolatile memory device to perform the pre-program and the main program on all or some of the plurality of memory blocks.

16. A nonvolatile memory device comprising:
a memory cell array comprising a plurality of cell strings, each of the cell strings comprising a selection transistor that selects the cell string for a program, read, or erase operation and a plurality of memory cells that store data for later retrieval;

a row decoder circuit that addresses the selection transistor of each of the cell strings separately and, for each of the cell strings, addresses each of the memory cells of the cell string through a separate word line, each of the word lines addressing a single memory cell within each of the cell strings;

a page buffer circuit that addresses all of the cell strings through a same bit line; and a control logic circuit that controls the row decoder circuit and the page buffer circuit to perform a pre-program operation of increasing a threshold voltage of every selection transistor addressed by the bit line before executing a program verification operation on any of the selection transistors addressed by the bit line.

17. The nonvolatile memory device of claim 16, wherein the threshold voltage of each of the selection transistors is increased beyond a turn-off voltage of the selection transistor.

18. The nonvolatile memory device of claim 16, wherein each of the selection transistors is a string selection transistor that is switched-on to provide a current path to the bit line for the cell string to which the string selection transistor belongs and is switched-off so as not to provide the current path to the bit line for the cell string to which the string selection transistor belongs.

19. The nonvolatile memory device of claim 16, wherein each of the selection transistors is a ground selection transistor that is switched-on to provide a current path to a reference potential for the cell string to which the ground selection transistor belongs and is switched-off so as not to provide the current path to the reference potential for the cell string to which the ground selection transistor belongs.

20. The nonvolatile memory device of claim 16, wherein:

each of the cell strings comprises two selection transistors, a first of the two selection transistors being a string selection transistor that is switched-on to provide a current path to the bit line for the cell string to which the string selection transistor belongs and is switched-off so as not to provide the current path to the bit line for the cell string to which the string selection transistor belongs, a second of the two selection transistors being a ground selection transistor that is switched-on to provide a current path to a reference potential for the cell string to which the ground selection transistor belongs and is switched-off so as not to provide the current path to the reference potential for the cell string to which the ground selection transistor belongs, and the pre-program operation comprises:

incrementing a threshold voltage of every string selection transistor addressed by the bit line before executing a program verification operation on any of the string selection transistors addressed by the bit line, and incrementing a threshold voltage of every ground selection transistor addressed by the bit line before executing a program verification operation on any of the ground selection transistors addressed by the bit line.

* * * * *